United States Patent
Zell et al.

[11] Patent Number: 5,217,381
[45] Date of Patent: Jun. 8, 1993

[54] CODING MECHANISM HAVING INTEGRATED SPECIAL CONTACTS FOR ELECTRICAL ASSEMBLIES PLUGGABLE ONTO A BACKPLANE WIRING

[75] Inventors: Karl Zell, Niederpoecking; Hans-Jost Heimueller, Dudenhofen; Peter Seidel, Groebenzell, all of Fed. Rep. of Germany

[73] Assignee: Siemens Aktiengesellschaft, Munich

[21] Appl. No.: 753,840

[22] Filed: Sep. 3, 1991

[30] Foreign Application Priority Data

Sep. 4, 1990 [DE] Fed. Rep. of Germany ....... 4028013

[51] Int. Cl.⁵ ............................................. H01R 9/09
[52] U.S. Cl. ....................................... 439/79; 439/680
[58] Field of Search ............... 439/55, 78, 79, 80, 439/680, 681

[56] References Cited

U.S. PATENT DOCUMENTS

| | | | |
|---|---|---|---|
| 3,112,974 | 12/1963 | Curtis et al. | 439/681 X |
| 4,035,047 | 7/1977 | Ammon | 439/78 |
| 4,173,387 | 11/1979 | Zell | 439/78 X |
| 4,398,779 | 8/1983 | Ling | 439/680 X |
| 4,415,214 | 11/1983 | Obst | 439/353 |
| 4,478,469 | 10/1984 | Waite et al. | 439/680 X |
| 4,772,227 | 9/1988 | Pelzl et al. | 439/681 |
| 4,790,763 | 12/1988 | Weber et al. | 439/65 |

FOREIGN PATENT DOCUMENTS

85P1187DE 3/1985 Fed. Rep. of Germany .

*Primary Examiner*—Larry I. Schwartz
*Assistant Examiner*—Khiem Nguyen
*Attorney, Agent, or Firm*—Hill, Steadman & Simpson

[57] ABSTRACT

A coding mechanism for assemblies pluggable onto a backplane wiring is provided. The backplane wiring is composed of a wiring backplane having contact blades introduced thereinto, and of blade connectors pluggable thereonto and designed as a rectangular housing open at one side for the acceptance of spring clips which are rigidly connected to electrical assemblies. Both the blade connectors as well as the spring clips are composed of individual sub-strips whose lengths correspond to single or multiples of the length of a given sub-segment. Sub-strips of both the blade connector as well as of the spring clip having the length of a sub-segment are partially designed as corresponding coding units in combination with special contacts, and can be attached at arbitrary locations of the strips.

7 Claims, 2 Drawing Sheets

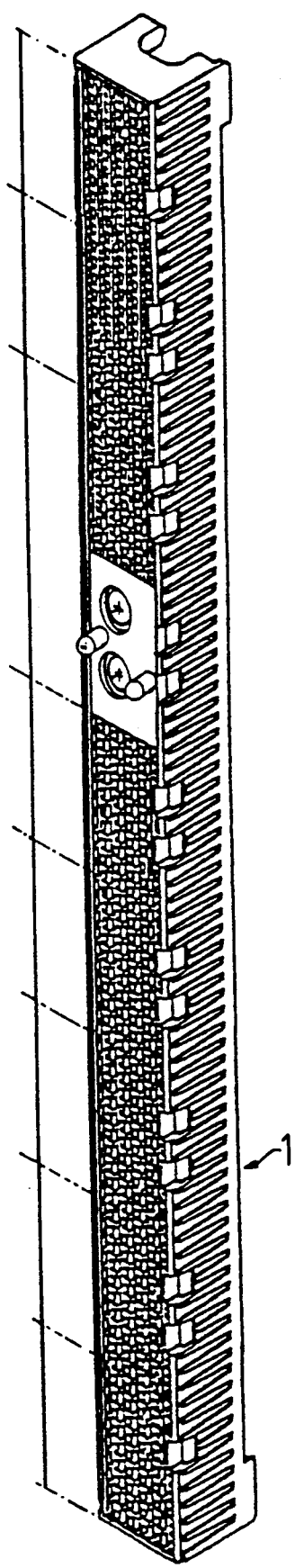
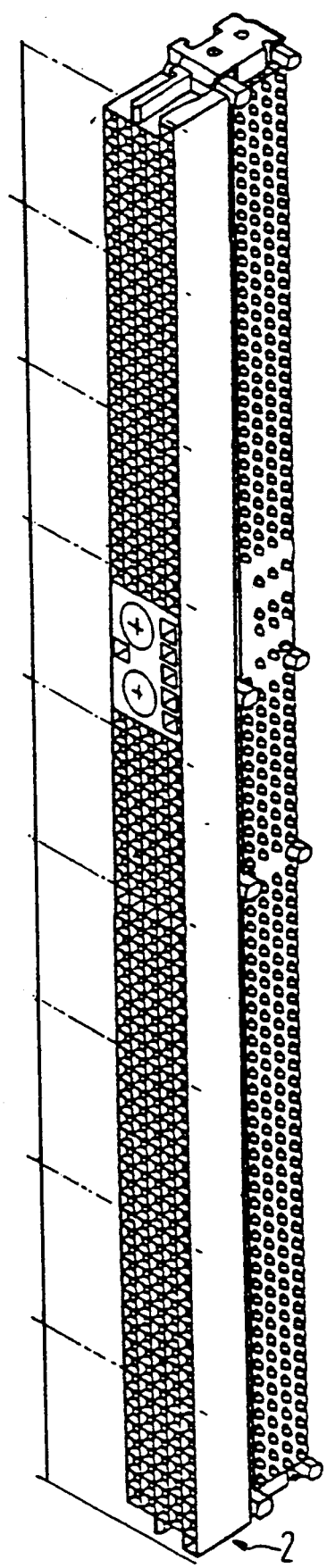
FIG 1
FIG 2

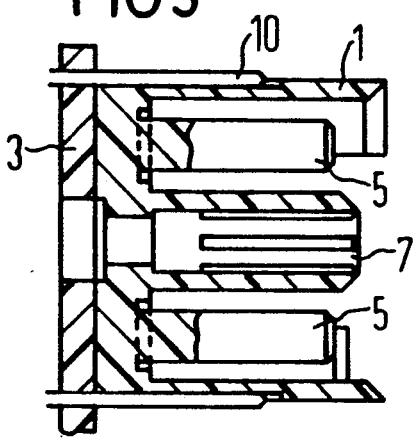
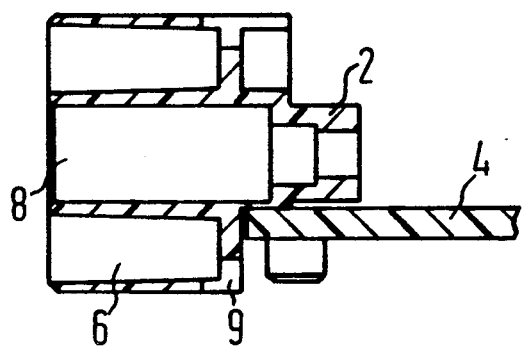
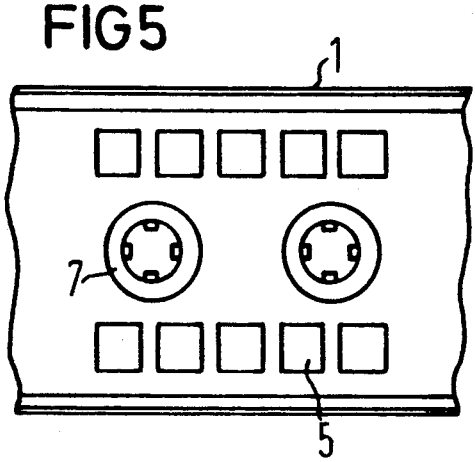
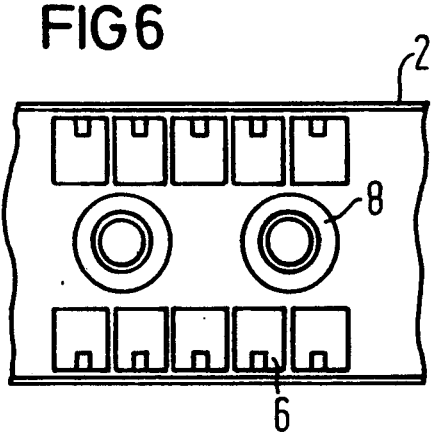
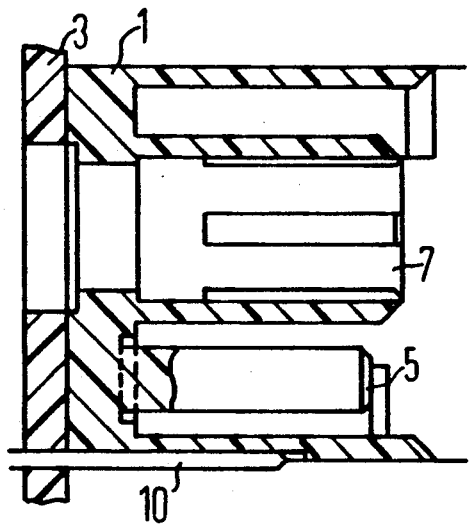
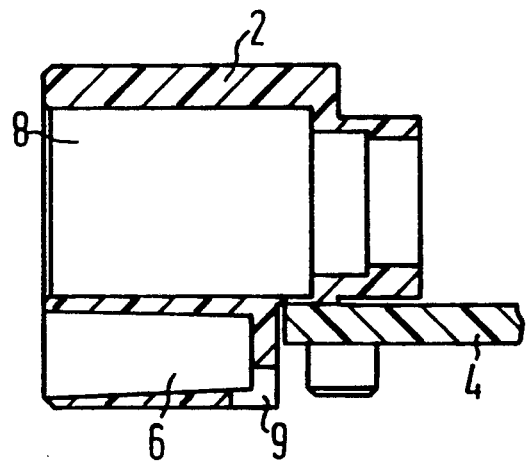

CODING MECHANISM HAVING INTEGRATED SPECIAL CONTACTS FOR ELECTRICAL ASSEMBLIES PLUGGABLE ONTO A BACKPLANE WIRING

BACKGROUND OF THE INVENTION

The invention is directed to a coding mechanism for assemblies pluggable into a backplane wiring. The backplane wiring is composed of a wiring backplane having contact blades introduced thereinto, and of blade connectors pluggable thereonto. A rectangular housing open at one side is provided for the acceptance of spring clips which are firmly joined to electrical assemblies. Both the blade connectors as well as the spring clips are composed of individual sub-strips whose lengths correspond to a single or multiple of the length of a given sub-segment.

Such backplane wirings are disclosed, for example, by German Utility Model 9509375, incorporated herein. Their advantage is that a single embodiment suffices for all demands possibly deriving, given a wiring backplane occupied by pins arranged in grid-like fashion.

Traditional coding mechanisms are not suitable for such backplane wirings since one part of the coding mechanism must be arranged next to the blade connector and, thus, an optimum equipping of the wiring backplane with assemblies can no longer be realized. A traditional coding mechanism of this type for a plug connection composed of blade connectors and spring clips is disclosed, for example, by German Utility Model 8428427, incorporated herein. An optimum equipped with additional, special contacts. In these cases, a modular arrangement, and thus an arbitrary arrangement within the plug, is not possible.

SUMMARY OF THE INVENTION

It is an object of the present invention to specify a coding mechanism of the type initially cited having integrated special contacts which enable an optimum equipping of the wiring backplane with assemblies, given a wiring backplane having contact blades introduced thereinto.

For a coding mechanism of the above-recited type, this object is inventively achieved in that sub-strips of both the blade connector as well as of the spring clip having the length of a sub-segment are designed as corresponding coding units having integrated special contacts, and can be applied to arbitrary locations of the connectors. Thus, coding units and special contacts are respectively provided, instead of a given number of contact blades and the spring clips corresponding thereto.

Since the coding units with the special contacts are arranged within the dimensions of the coding strip in the coding mechanism of the invention, the wiring backplane can be optimally equipped with assemblies given the coding mechanism of the invention. Coding possibilities and special contacts can be accommodated in common within a given division and can be modularly arranged in plug connector modules. An arbitrary arrangement within the plug connectors, i.e. within the modular division, is possible in various installations.

An expedient development of the coding mechanism of the invention is that the special contacts are centrally arranged in a longitudinal direction and wherein different numbers of coding units are arranged at both sides of the special contacts. This arrangement is especially suitable for miniaturized special contacts.

Another expedient development of the coding mechanism of the invention is that the special contacts ar eccentrically arranged at a longitudinal side of the sub-segment and in that a plurality of coding units are arranged in a row at the other longitudinal side. These arrangements are particularly suitable for traditional, standardized special contacts.

Another expedient development of the coding mechanism of the invention is that the coding units are composed of depressions on the one hand and, on the other hand, of pins. This embodiment enables a great number of coding possibilities in a simple way.

BRIEF DESCRIPTION OF THE DRAWINGS

FIG. 1 is a perspective view of a blade connector for the acceptance of the contact blades of the wiring backplane;

FIG. 2 is a perspective view of a corresponding spring clip for plugging onto the contact blades;

FIG. 3 shows a cross section through a blade connector of a coding mechanism having centrally arranged special contacts;

FIG. 4 is a cross section through a spring clip of a coding mechanism having centrally arranged special contacts;

FIG. 5 is a plan view onto a blade connector of a coding mechanism having centrally arranged special contacts;

FIG. 6 is a plan view onto a spring clip of a coding mechanism having centrally arranged special contacts;

FIG. 7 is a cross section through a blade connector of a coding mechanism having eccentrically arranged special contacts; and FIG. 8 shows a cross section through a spring clip of a coding mechanism having eccentrically arranged special contacts.

DESCRIPTION OF THE PREFERRED EMBODIMENTS

FIG. 1 shows a blade connector 1 that is essentially composed of a rectangular housing open at one side through whose bottom openings contact blades of the wiring backplane 3 project. FIG. 2 shows the spring clip 2 corresponding thereto which is rigidly connected to an assembly board 4. Both the blade connectors 1 as well as the spring clips 2 are composed of individual sub-strips whose lengths correspond to a single or multiple of the length of a given sub-segment, as indicated in FIGS. 1 and 2.

FIGS. 3 through 6 then show an embodiment of the coding mechanism of the invention, wherein the special contacts are centrally arranged. It may be seen in the corresponding figures that the special contact plugs 7 as well as the special contact jacks 8 are successively arranged along the longitudinal axis of blade connector 1 and spring clip 2. Dependent on the size of the sub-segment, a different plurality of special contacts can be provided. The coding pins 5 are arranged in a longitudinal direction on the blade connector 1 at both sides of the special contacts, and the coding chambers 6 are arranged on the spring clip 2 at both sides of the special contacts. The coding pins 5 can be broken off and can be pressed into the coding chambers 6. A clearance 9 in the corresponding sub-segment of the spring clip 2 permits a removal of the impressed coding pins. It is also possible to press separate coding pins which are not broken off into the coding chambers.

The embodiment shown in FIGS. 3 through 6 is particularly suitable for miniaturized special contacts, whereby high-power, KOAX or LWG contacts can be specifically involved. The embodiment of the coding mechanism of the invention shown in FIGS. 7 and 8, by contrast, is particularly suited for the employment of special contacts standardized according to DIN 41626, whereby these contacts can also be a matter of either high-power, KOAX or LWG contacts.

Due to the size of the standardized special contacts, these are eccentrically arranged and coding units are arranged in a row at only one longitudinal side.

Although various minor changes and modifications might be proposed by those skilled in the art, it will be understood that we wish to include within the claims of the patent warranted hereon all such changes and modifications as reasonably come within our contribution to the art.

We claim as our invention:

1. A coded contact system for use with a wiring backplane having a plurality of spaced contact blades protruding outwardly from the backplane, comprising:

at least one connector and means associated with the connector for plugging the connector onto the substantially between at least two of said plurality of contact blades which are adjacent one another, said connector being designed as a rectangular housing having an opening at one side and wherein a base portion of the connector opposite the opening is adjacent the wiring backplane;

at least one spring clip rigidly attached to an electrical assembly, and said opening in said rectangular housing being shaped for telescopically receiving therein said spring clip;

the connector having a contact and the spring clip having a contact, said two contacts being mateable together when the spring clip is plugged into the connector; and the connector having at least one coding means lying inwardly of the two adjacent contact blades when the connector is plugged onto the contact blades and lying between the connector contact and adjacent one of said two contact blades, and said spring clip having a corresponding coding means for interacting with the coding means on the connector, said coding means on said connector and on said spring clip, depending on a coding state thereof, permitting or preventing plugging of the spring clip onto the blade connector.

2. A system according to claim 1 wherein the coding means of the spring clip comprises a chamber and said coding means of said connector comprises a coding pin and wherein coding one of the state which is established comprises placement of a pin within the coding chamber to block it off and prevent the coding pin of the connector from being plugged therein, and another coding state allowing plugging of the spring clip into the connector comprises the coding chamber being empty and the coding pin of the connector being plugged into the coding chamber with the clip plugged into the connector.

3. A system according to claim 1 wherein said connector has a first coding member between the contact and one of the two adjacent contact blades and a second coding member between the other adjacent contact blade and said contact, and wherein said spring clip has a first coding member lying to one side of its contact and another coding member positioned at an opposite side of said contact.

4. A system according to claim 3 wherein the first and second coding members of the connector comprise first and second coding pins and the first and second coding members of the spring clip comprise first and second coding chambers dimensioned to receive the coding pins when the clip is plugged into the connector.

5. A system according to claim 1 wherein the contact of the connector comprises a contact plug and the contact of the spring clip comprises a contact jack received within the contact plug.

6. A system according to claim 1 wherein said connector comprises a plurality of contacts with associated coding means all formed in a single rectangular housing with each contact and its adjacent at least one coding means being provided between adjacent pairs of contact blades.

7. A coded contact system for use with a wiring backplane having a plurality of spaced contact blades protruding outwardly from the backplane, comprising:

at least one connector and means associated with the connector for plugging the connector onto and substantially between at least two of said plurality of contact blades which are adjacent one another, said connector having an opening at one side;

at least one spring clip rigidly attached to an electrical assembly, and said opening in said rectangular housing being shaped for telescopically receiving therein said spring clip;

the connector having a contact and the spring clip having a contact, said two contacts being mateable together when the spring clip is plugged into the connector; and the connector having at least one coding means lying inwardly of the two adjacent contact blades when the connector is plugged onto the contact blades and lying between the connector contact and an adjacent one of said two contact blades, and said spring clip having a corresponding coding means for interacting with the coding means on the connector, said coding means on said connector and on said spring clip, depending on a coding sate thereof, permitting or preventing plugging of the spring clip onto the blade connector.

* * * * *